United States Patent [19]

Kubota

[11] Patent Number: 5,065,215
[45] Date of Patent: Nov. 12, 1991

[54] SEMICONDUCTOR MEMORY CELL AND METHOD OF MANUFACTURING THE SAME

[75] Inventor: Taishi Kubota, Tokyo, Japan
[73] Assignee: NEC Corporation, Japan
[21] Appl. No.: 542,427
[22] Filed: Jun. 22, 1990

[30] Foreign Application Priority Data

Jun. 28, 1989 [JP] Japan .................... 1-167558

[51] Int. Cl.$^5$ ............... H01L 27/10; H01L 27/15; H01L 29/78; H01L 27/02
[52] U.S. Cl. ................................ 357/45; 357/23.6; 357/41
[58] Field of Search .............. 357/23.6, 45, 41; 365/182

[56] References Cited

U.S. PATENT DOCUMENTS

| 4,807,017 | 2/1989 | Ema et al. | 357/68 |
| 4,845,544 | 7/1989 | Shimizu | 357/71 |
| 4,894,696 | 1/1990 | Takeda et al. | 357/23.6 |
| 4,910,566 | 3/1990 | Ema | 357/23.6 |
| 4,927,779 | 5/1990 | Dhong et al. | 428/52 |
| 4,935,791 | 6/1990 | Namaki | 357/23.5 |

FOREIGN PATENT DOCUMENTS

| 58-199557 | 11/1983 | Japan | 357/23.6 |
| 60-145655 | 8/1985 | Japan | 357/45 |
| 61-136256 | 6/1986 | Japan | 357/23.6 |
| 61-274358 | 12/1986 | Japan | 357/23.6 |
| 62-245658 | 10/1987 | Japan | 357/45 |
| 62-249477 | 10/1987 | Japan | 357/45 |
| 1-080060 | 3/1989 | Japan | 357/23.6 |

OTHER PUBLICATIONS

Stacked Capacitor Cells for High-Density Dynamic RAMs, by Hidehiro Watanabe, 1988 IEDM, pp. 600–603.

Primary Examiner—Andrew J. James
Assistant Examiner—Stephen D. Meier
Attorney, Agent, or Firm—Laff, Whitesel, Conte & Saret

[57] ABSTRACT

A semiconductor memory includes a plurality of semiconductor memory cells formed in a matrix form on a semiconductor substrate, each semiconductor memory cell having a memory cell including a trench capacitor, a bit line, and a word line extending perpendicularly to the bit line. The word lines of semiconductor memory cells adjacent in a direction of the bit lines substantially vertically overlap each other. A method of manufacturing the above semiconductor memory includes the steps of forming a first word line of a given semiconductor memory cell, and forming a second word line of a semiconductor memory cell adjacent to the given semiconductor memory cell in a direction of the bit line on the first word line, so that the second word line overlaps the first word line in a substantially insulated state.

4 Claims, 4 Drawing Sheets

SEMICONDUCTOR MEMORY CELL AND METHOD OF MANUFACTURING THE SAME

BACKGROUND OF THE INVENTION

The present invention relates to a semiconductor memory cell and a method of manufacturing the same.

Semiconductor memory elements, particularly, silicon dynamic memory elements have become highly integrated, and the memory cell area is decreasing. Since an amount of charge stored in one cell is limited by sensitivity of a sense amplifier and resistance to alpha-particles, the memory cell area cannot be reduced without limits. For this reason, various memory cell structures free from a decrease in charge amount even in an area smaller than that of a conventional cell have been proposed.

For example, there is a paper entitled as "Stacked Capacitor Cells for High-Density Dynamic RAMs", International Electron Devices Meeting Technical Digest, pp. 66–603, 1988.

In this paper, a memory cell having a structure shown in FIGS. 3A and 3B is proposed. This structure employs a layout called a "folded bit line structure" to assure noise resistance of a dynamic memory element. Each memory cell includes a first word line 302 for turning on/off the memory cell in an element region encircled by a boundary 301 and a second word line 303 for turning on/off a memory cell in an adjacent element region encircled by a boundary 301A in a direction parallel to a bit line 308. A capacitor of each memory cell is formed in a trench 304 as a stacked capacitor constituted of a charge storage polysilicon layer 305, a dielectric insulating film 309, and a counter electrode 313. This memory cell is characterized by a combination of a conventional stacked capacitor with a trench capacitor. When the memory cell area is to be reduced, this combination can easily assure a required storage capacitance as compared with a simple stacked or trench capacitor. The bit line 308 is formed on an insulating interlayer 307 and contacted with a source (drain) region 315 through a bit line contact hole 306 formed in the insulating interlayer 307 and an insulating interlayer 310. Reference numeral 316 denotes a gate insulating film.

In the conventional memory cell described above, as shown in FIG. 3B, since the trench capacitor is formed between the two word lines 302, 303 formed in the cell, an opening of the trench cannot be assured to be large, and a sufficient capacitance cannot be assured. This drawback is caused by the following reason. Since a fabrication process for simultaneously forming all word lines is employed, the second word line of a given cell is separated by a given gap from the second word line of a cell adjacent to the given cell in a direction parallel to the bit line. The distance between the two word lines within the given memory cell is shortened.

SUMMARY OF THE INVENTION

It is an object of the present invention to provide a semiconductor memory cell and a method of manufacturing the same wherein a distance between two word lines formed within a given memory cell is increased, an opening of a trench formed between the two word lines is increased, and a large storage capacitance can be assured.

In order to achieve the above object, according to an aspect of the present invention, there is provided a semiconductor memory comprising a plurality of semiconductor memory cells formed in a matrix form on a semiconductor substrate, each semiconductor memory cell having a memory cell including a trench capacitor, a bit line, and a word line extending perpendicularly to the bit line, wherein the word lines of semiconductor memory cells adjacent in a direction of the bit line substantially vertically overlap each other.

In order to achieve the above object, according to another aspect of the present invention, there is provided a method of manufacturing a semiconductor memory having a plurality of semiconductor memory cells formed in a matrix form on a semiconductor substrate, each semiconductor memory cell having a memory cell including a trench capacitor, a bit line, and a word line extending perpendicularly to the bit line, comprising the steps of forming a first word line of a given semiconductor memory cell, and forming a second word line of a semiconductor memory cell adjacent to the given semiconductor memory cell in a direction of the bit line on the first word line, so that the second word line overlaps the first word line in a substantially insulated state therefrom.

DESCRIPTION OF THE PREFERRED EMBODIMENT

Figure 1A:
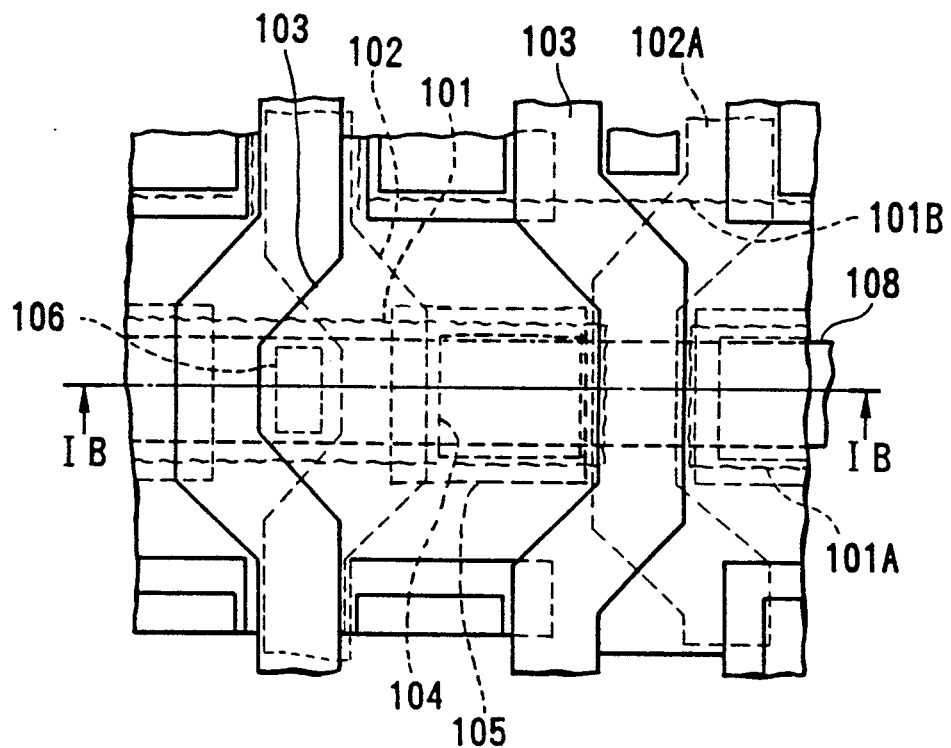
FIG. 1A is a plan view of a memory cell according to an embodiment of the present invention.
Figure 1B:
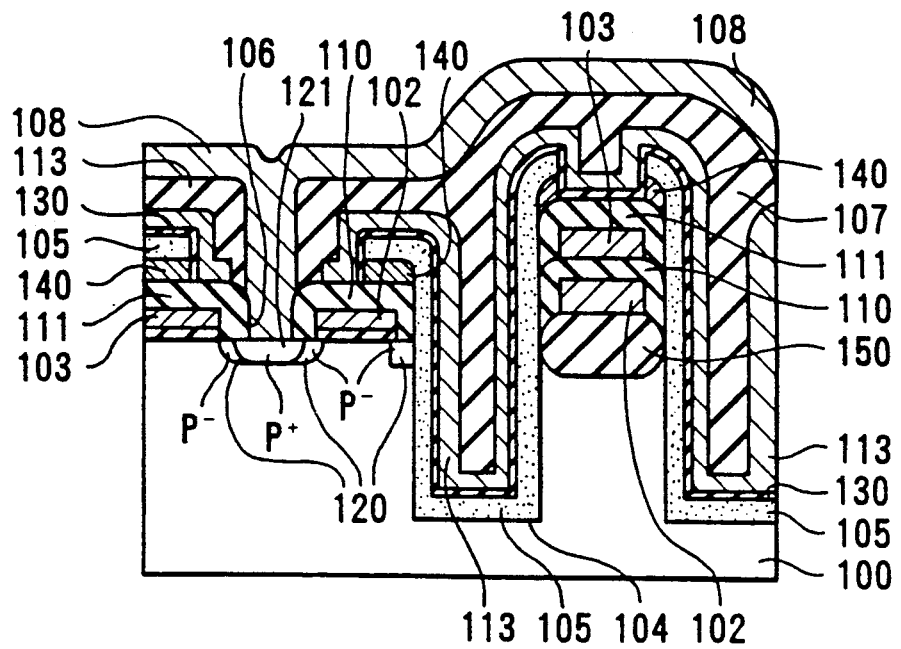
FIG. 1B is a sectional view of the memory cell along the line 1B—1B of FIG. 1A.

FIG. 1A shows a memory cell according to an embodiment of the present invention, and FIG. 1B shows a section of the memory cell along the line 1B—1B.

In this embodiment, a first word line 102 is formed in an element region surrounded by a dotted line 101 showing a boundary between an element region and an element isolation region. A second word line 103 for turning on/off a cell adjacent in a direction parallel to the first word line 102 is formed on the first word line 102A of another cell formed in the element isolation region. Therefore, the first word line 102A and the second word line 103 vertically overlap each other between the boundary 101 and a boundary 101A, as is apparent from FIGS. 1A and 1B. In this case, the boundary 101A is an element region formed on the same bit line 108 as that of the boundary 101 and is separated from the boundary 101.

The word lines 102A and 103 which overlap each other between the boundaries 101 and 101A are located on different active regions in cells adjacent in the vertical direction, i.e., the word line direction. After the word lines 102A and 103 are formed in the corresponding active regions of cells adjacent in the bit line direction, these lines 102A and 103 vertically overlap each other on a field oxide film, i.e., an element isolation oxide film 150, in the first adjacent cell in the word line direction. In the second adjacent cell, the word lines 102A and 103 are located in corresponding active regions spaced apart from each other along the bit line direction. The above layout can be obtained by a staggered structure with reference a given word line such that cells adjacent to each other in the column direction are shifted by ½ of the word line length in the horizontal direction. A trench 104 is formed to be almost included in the boundary 101 and is quadlateral in its planar shape. A charge storage polysilicon layer 105 is deposited in this trench 104.

The bit line 108 horizontally extends on an insulating interlayer 107. This bit line is connected to a p+-type source (drain) region 121 through a bit line contact hole 106 formed in the insulating interlayer 107. Reference numeral 111 in FIG. 1B denotes an insulating film; 120, a p−-type layer; 130, a dielectric insulating film; and 140, a conductive film.

FIGS. 2A to 2E show the steps in manufacturing the semiconductor memory cell of this embodiment.

Figure 2A:
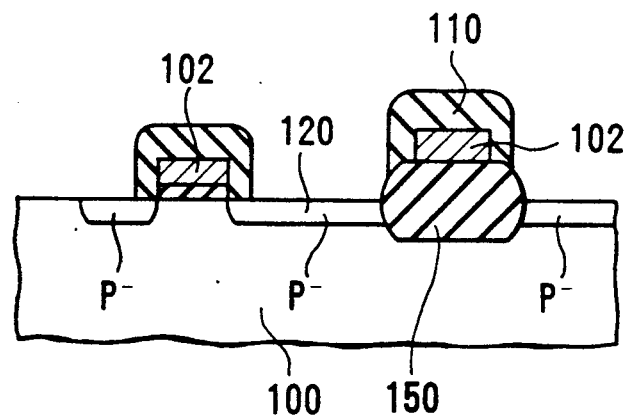
FIGS. 2A to 2E are sectional views showing the steps in manufacturing the memory cell according to the embodiment shown in FIGS. 1A and 1B.
Figure 2B:
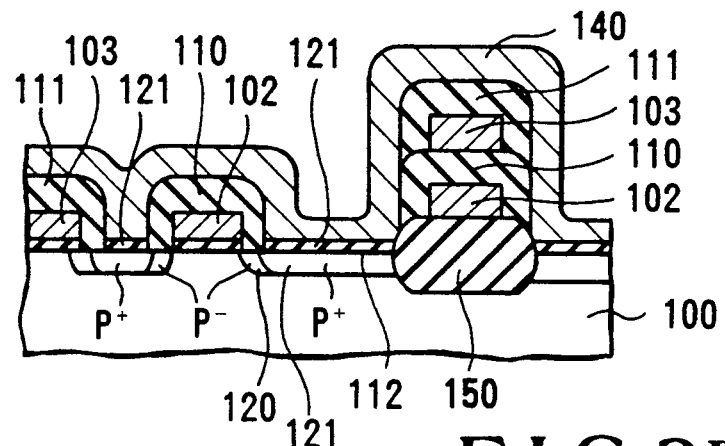

As shown in FIG. 2A, the element isolation oxide film 150 is formed on a silicon substrate 100 by selective oxidation at 1,000° C. A polysilicon film is deposited by CVD using silane, and phosphorus is diffused at 900° C. to obtain a low sheet resistance of 20 Ω/□. An oxide film is deposited by CVD using silane and oxygen, and the oxide film and the polysilicon film are etched by lithographic and etching techniques. After a PR step, boron fluoride is ion-implanted at a dose of $5 \times 10^{13}$ ions.cm$^{-2}$ to form p−-type layers 120. An oxide film is then deposited again by CVD using silane and oxygen and is etched back to leave the oxide film on only the side wall portions, thereby forming first word lines (low-resistance polysilicon) 102 and an oxide film 110 having an LDD structure, as shown in FIG. 2A.

As in the step of forming the first word lines 102, second word lines (low-resistant polysilicon) 103 and an oxide film 111 are formed. Boron fluoride is ion-implanted at a dose of $5 \times 10^{15}$ ion.cm$^{-2}$ to form the p+-type layers 121. The upper portions of the p+-type layers are covered with a thin oxide film 112 by CVD. A thick polysilicon layer 140 is deposited by CVD, and phosphorus is diffused therein to obtain a low resistance, thereby obtaining a structure shown in FIG. 2B. This thick polysilicon layer 140 is generally used to increase a charge storage amount of a stacked capacitor.

Figure 2C:
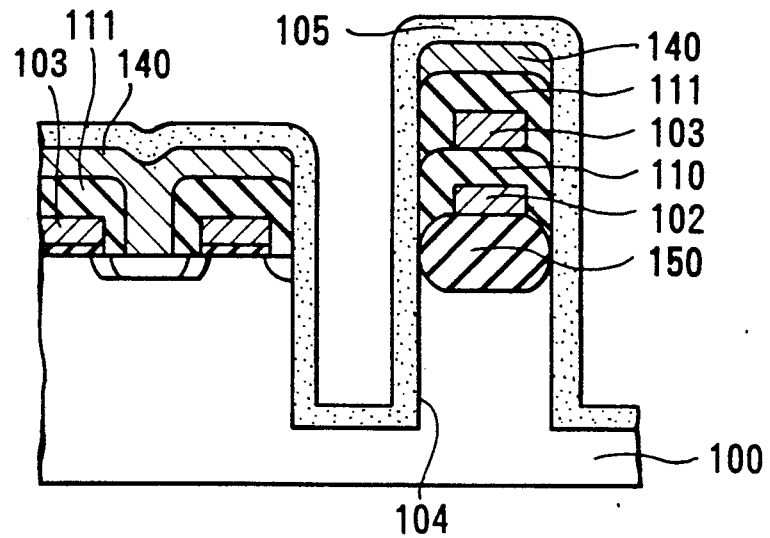

As shown in FIG. 2C, the thick polysilicon layer 140, the thin oxide film 112, the p+-type layer 121, and the silicon substrate 110 between the first and second word lines are etched by reactive ion etching to form a trench 104. A polysilicon layer is deposited in the trench 104 by CVD, and phosphorus is diffused to obtain a low resistance, thereby forming the charge storage polysilicon layer 105.

Figure 2D:
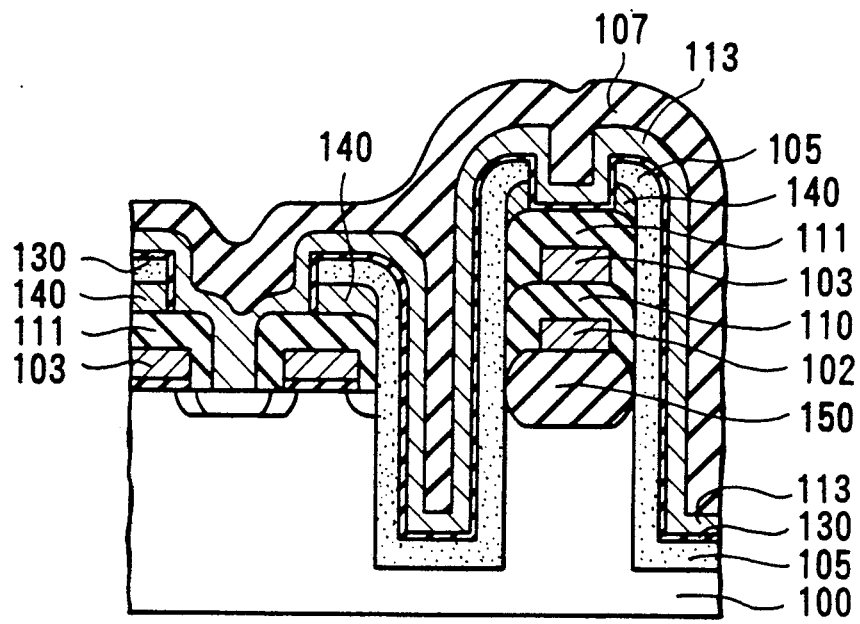

As shown in FIG. 2D, the charge storage polysilicon layer 105 is etched by reactive ion etching. A dielectric insulating film 130, a counter electrode 113, and the insulating interlayer 107 are deposited. The dielectric insulating film has a three-layered structure (i.e., $SiO_2$/$Si_3N_4$/$SiO_2$) by deposition of a silicon nitride film by CVD using silane and ammonia and oxidation of the silicon nitride film. The counter electrode 113 is formed by deposition of a polysilicon film and phosphorus diffusion to obtain a low resistance. The insulating interlayer is an oxide film formed by CVD.

Figure 2E:
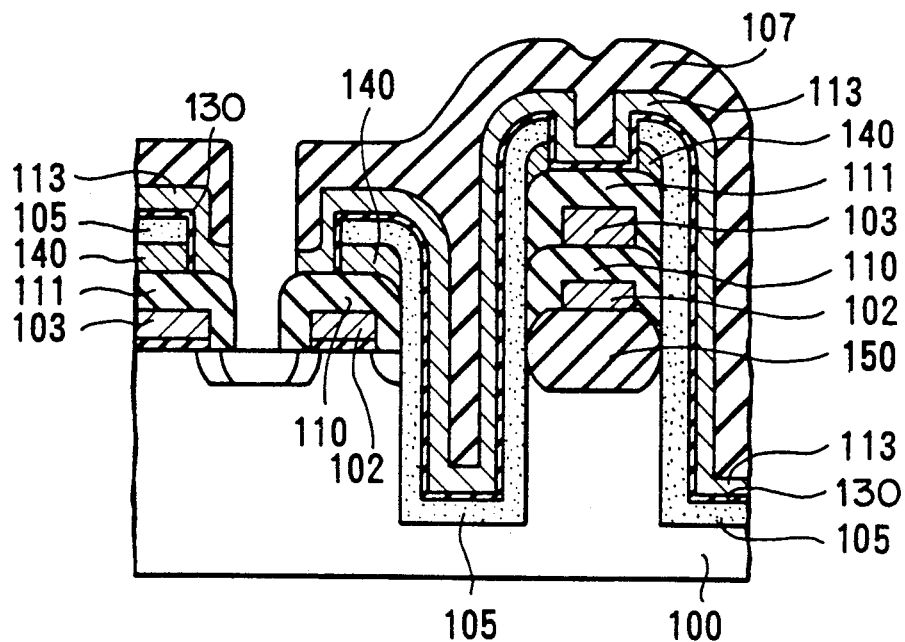
Figure 3A:
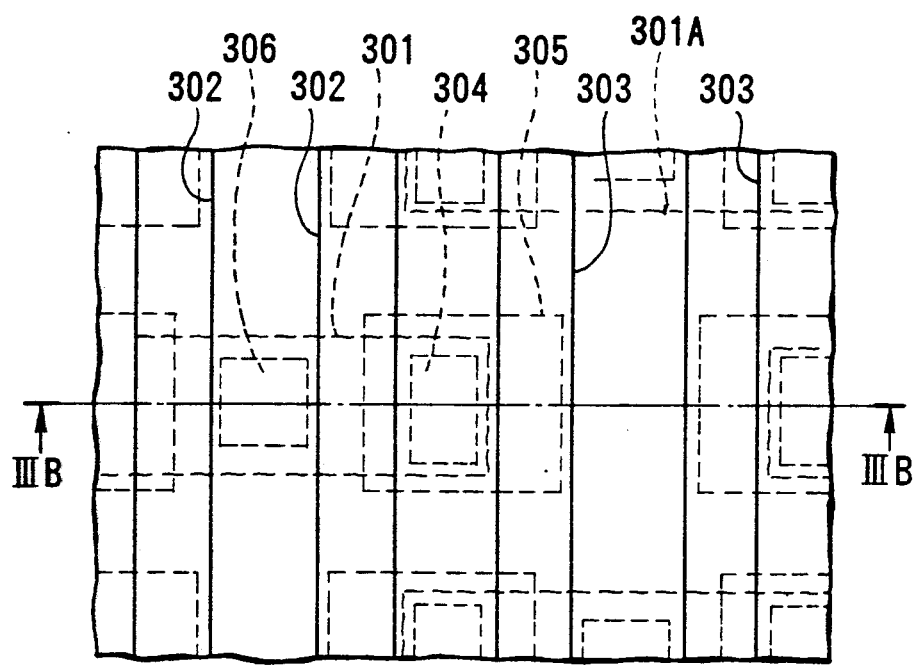
FIG. 3A is a plan view of a conventional memory cell.
Figure 3B:
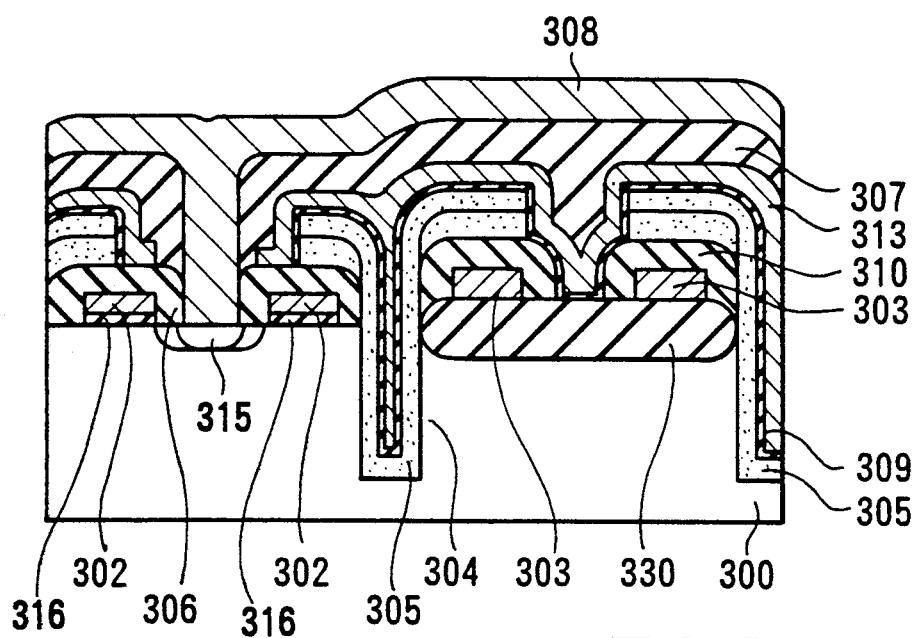
FIG. 3B is a sectional view of the conventional memory cell along the line 3B—3B in FIG. 3A.

As shown in FIG. 2E, the insulating interlayer 107 and the counter electrode 113 are etched by reactive ion etching to expose a portion connected to the bit line.

With the above structure, the trench of the memory cell including a trench capacitor reaches the semiconductor substrate 100. From this viewpoint, the charge storage capacitance can be increased.

In addition, since the semiconductor substrate is not insulated from the charge storage electrode 105 in this memory cell, the charge storage capacitance can be further increased.

As has been described above according the present invention, the step of forming the second word line for turning on/off a cell adjacent to a given cell in a direction parallel to the word line is performed after the step of forming the first word line for turning on/off the given cell. The second word line of an adjacent cell in a direction parallel to the bit line is formed under or on the second word line. A distance between the two word lines in the memory cell can be increased, the opening of the trench formed between the two word lines can be increased, and a large storage capacitance can be assured.

What is claimed is:

1. A semiconductor memory comprising:
   a semiconductor substrate;
   a plurality of semiconductor memory cells formed in a matrix form on said semiconductor substrate;
   each semiconductor memory cells including a trench capacitor, a bit line, and a word line extending perpendicularly to said bit line,
   said trench capacitor including a charge storage insulating layer in a trench formed on said semiconductor substrate, a counter electrode formed on said insulating layer, a first active region formed at an open portion of said trench, and a second active region which is separate from said first active region formed on said semiconductor substrate,
   said word line being provided on said semiconductor substrate through an insulating layer which acts as a switching element in cooperation with said first and second active region,
   said bit line being coupled to said second active region,
   said switching element and said trench being arranged in a direction corresponding to the direction of said bit line, so that switching elements and trenches of neighboring cells are arranged reversely and in parallel t the bit line, and
   word lines of the semiconductor memory cells which are adjacent in the direction of said bit lines being arranged to be separate from each other at a portion in which switching elements are neighbors and to substantially vertically overlap each other at a portion in which said trenches are neighbors.

2. A memory according to claim 1, said trench reaches said semiconductor substrate to increase a charge storage capacitance of said memory cells.

3. A memory according to claim 1, wherein said trench is formed between said overlapping word lines and another word line which is adjacent to said overlapping word lines.

4. A memory according to claim 1, wherein said memory cell includes a charge storage electrode inside said trench, said electrode being not insulated from said semiconductor substrate.

* * * * *

UNITED STATES PATENT AND TRADEMARK OFFICE
CERTIFICATE OF CORRECTION

PATENT NO.   :   5,065,215
DATED        :   November 12, 1991
INVENTOR(S)  :   Taishi Kubota, Tokyo, Japan It is certified that error appears in the above-identified patent and that said Letters Patent is hereby corrected as shown below:

Col. 1, line 21, "66-603"
should be --600-603--;

Col. 3, line 30, "ions.cm"
should be --ions·cm--;

Col. 3, line 39 "ion.cm"
should be --ions·cm--;

Signed and Sealed this

Eighth Day of March, 1994

Attest:

BRUCE LEHMAN

Attesting Officer

Commissioner of Patents and Trademarks